United States Patent [19]

Besselere et al.

[11] 3,984,280
[45] Oct. 5, 1976

[54] MAKING ROD-SHAPED SINGLE CRYSTALS BY HORIZONTAL SOLIDIFACTION FROM A MELT USING TRANSVERSALLY ASYMMETRIC TROUGH-SHAPED RESISTANCE HEATER HAVING TRANSVERSE HALF TURNS

[75] Inventors: Jean-Pierre Besselere, Plumetot,Douvres; Bernard Lambert, Mathieu, both of France

[73] Assignee: U.S. Philips Corporation, New York, N.Y.

[22] Filed: Aug. 11, 1975

[21] Appl. No.: 603,513

Related U.S. Application Data

[63] Continuation of Ser. No. 377,071, July 6, 1973, abandoned.

[52] U.S. Cl............................ 156/609; 156/616 A; 156/617 H; 156/619; 156/DIG. 70; 156/DIG. 81; 23/273 SP
[51] Int. Cl.² .................... B01J 17/08; B01J 17/20; C01B 27/00; C01G 15/00
[58] Field of Search........ 156/616 R, 616 A, 617 H, 156/617 M, 617 V, 609; 23/273 SP

[56] References Cited
UNITED STATES PATENTS

| | | | |
|---|---|---|---|
| 2,719,799 | 10/1955 | Christian | 156/616 |
| 2,773,923 | 12/1956 | Smith | 156/617 H |
| 2,902,350 | 9/1959 | Jenny | 23/273 SP |
| 2,966,537 | 12/1960 | Witucks | 156/617 |
| 2,967,095 | 1/1961 | Herrick | 156/617 |
| 3,190,732 | 6/1965 | Hamilton | 156/617 H |
| 3,296,036 | 1/1967 | Keller | 156/617 M |
| 3,335,035 | 8/1967 | Marshall | 156/617 H |
| 3,359,077 | 12/1967 | Arst | 23/273 SP |

FOREIGN PATENTS OR APPLICATIONS

| | | | |
|---|---|---|---|
| 2,116,664 | 6/1972 | France | 156/616 |
| 1,383,400 | 2/1975 | United Kingdom | 156/616 |

OTHER PUBLICATIONS

Cunnell et al., Technology of Fallium Arsenide, vol. 1, pp. 97-106, 1960, pp. 97 to 106.

*Primary Examiner*—Stephen J. Emery
*Attorney, Agent, or Firm*—Frank R. Trifari; Norman N. Spain

[57] ABSTRACT

Rod shaped monocrystals are formed by causing monocrystalline deposition to take place in that body from a melt formed by heating a longitudinal section of that body with individual trough shaped heating elements.

19 Claims, 3 Drawing Figures

MAKING ROD-SHAPED SINGLE CRYSTALS BY HORIZONTAL SOLIDIFACTION FROM A MELT USING TRANSVERSALLY ASYMMETRIC TROUGH-SHAPED RESISTANCE HEATER HAVING TRANSVERSE HALF TURNS

This is a continuation of application Ser. No. 377,071, filed July 6, 1973, now abandoned.

The invention relates to a method of manufacturing rod-shaped single crystals of a starting material in the form of an elongate body which is arranged approximately in a horizontal position, by monocrystalline deposition in the longitudinal direction of said body from a melt which is formed at least in a longitudinal part of said body, individually energizable heating elements being used of which at least one, which is not in contact with the body, assumes a transversally asymmetric position relative to the elongate body. The invention furthermore relates to a monocrystalline body obtained by using such a method and to an apparatus suitable for carrying out such a method. The term "body" is to be understood to be not restricted to a self-supporting body. For example, the body may also consist of incoherent lumps or loose powder. The starting material need not have the same composition as the single crystal to be manufactured. For example, it may contain, possibly locally, a meltable solvent. For the manufacture of single crystals from a compound, a mixture of the components may be used. One or more of such components may also be lacking and be added, during the crystal formation preferably from the gaseous phase, to the melt formed in the starting material and containing the remaining component or components. Dopes may also be added previously to the starting material or be added to the melt during the crystal growth, for example, from the gaseous phase.

The starting material may be a seed crystal but in principle it is also possible to initially form, by solidification, a single crystal nucleus or a number of crystal nuclei. In the latter case, the growth of one of the crystal nuclei may be stimulated at the expense of the other nuclei, for example, in that the place of said nucleus and/or the orientation thereof is most favourable.

Preceding the monocrystalline deposition, the starting material, apart from a possibly used seed crystal, may be melted entirely or over a longitudinal part at one of its ends. By displacing a temperature transition from high to lower temperature from the end in question in the direction of the other end, a solidification front is moved from said one end in the longitudinal direction of the melt, the possibly used seed crystal or a nucleus formed growing from the melt by deposition. when the melt is formed only over a part of the length of the elongate body in which a molten zone of restricted length is formed, according to the zone melting principle, the molten zone is conveyed entirely through the rod by moving the melting front in the same direction as the solidifcation front.

In technology, large single crystals, in particular rod-shaped single crystals, of various materials are used for different purposes, for example, piezoelectric crystals, rod-shaped crystals for solid-state lasers, and monocrystalline substrates from non-magnetizable garnets as supports for thin monocrystalline layers of magnetizable material for magnetic "bubbles". In behalf of semiconductor technology, single crystals from an insulating material are also manufactured for use as a substratum for layers of semiconductor material provided thereon epitaxially. In particular in behalf of the semiconductor technology, rod-shaped single crystals are manufactured from the semiconductor material itself, for example from germanium, silicon, semiconductor compounds of the III–V type, and other materials.

According to known embodiments of the method of the type described in the preamble, the body of the starting material is placed in a boat-like crucible, further named "vessel", possibly having a seed crystal at the end from which the crystal is to be grown. The danger exists that undesired crystal nuclei are formed at the wall of the vessel and start also growing in the solidification process, so that the growing crystal material no longer is monocrystalline. In order to check the growth of such nuclei or at least minimize it, it had already been proposed to use a convex solidification front, that is to say a solidification front which has proceeded less far in its direction of movement near the side walls and bottom of the vessel than in parts of the body of the starting material farther remote from the wall. Crystal nuclei can be formed along the walls only when the growing crystal has already passed such a nucleus site in places farther remote from the wall, so that a possible growth of the nucleus is restricted only to the crystal periphery.

In order to obtain such a solidification front, French Patent Specification No. 1,494,831 the contents of which are to be considered as incorporated in the present specification, describes an embodiment of a method of the type described in the preamble in which an elongate furnace was used in which an elongate hollow space was present in which the starting material was provided. Groups of mutualy independently energizable heating elements were used which assumed transversally different positions relative to the starting material. So this means that each of the said heating elements assumed a transversally asymmetric position relative to the starting material. The said heating elements were tubular of construction having their longitudinal direction in the longitudinal direction of the furnace and the group of heating elements extended over a longitudinal part of the furnace. The shape of the solidification front can be influenced by the extent of energisation of each of the said transversally differently arranged heating elements. In this manner it can also be tried to obtain the solidification front as flat as possible, for example, as described in British Patent Specification No. 824,341. As described in the said British Patent Specification, a single group of such heating elements may be used. The elongate batch of the starting material may be subjected to a zone melting process in which a molten zone is formed by means of the group of heating elements and, by moving the batch relative to the heating elements, said molten zone is moved through said batch in its longitudinal direction. It is also possible, as described in the above-mentioned French Patent Specification No. 1,494,831, to use a furnace having a row of juxtaposed groups of heating elements in its longitudinal direction and, by carefully programming the extent of energization of the heating elements, to move the solidification front through the starting material without it being necessary to use mechanically moving parts.

Single crystals, in particular semiconductor crystals of the III–V type, for example, of gallium arsenide, of good perfection and low dislocation densities have been obtained in particular with the method and apparatus as described in the French Patent Specification No. 1,494,831, in spite of the fact that the solidification process was carried out in a crucible.

One of the objects of the present invention is to provide a method of the type described in the preamble in which the crystal perfection is further improved and/or the crystal perfection is high also with comparatively large diameters. It is inter alia based on the idea that, while maintaining a non-rotationally symmetric transversal distribution of the thermal energy radiated towards the melt, an increase in a given manner of the uniformity of said transversal distribution may result in more optimum results and can enable the growth of larger crystals. It is furthermore based on the recognition of the fact that in the tubular heating elements used in known manner the parts of the material which are nearest to such a tubular element are heated more considerably than the parts of the material which are present at an equally large distance from two juxtaposed heating elements. As a result of this, a non-uniform distribution of the radiated thermal energy along the whole circumference of the material is formed which may cause side effects, such as the formation of crystal imperfections, dislocations, and even new crystal nuclei. The non-uniformity in the thermal distribution is the larger in particular for use with larger diameters, in which the distances between the heating elements should be chosen to be proportionally larger.

According to the invention, a method of the type described in the preamble is characterized in that such a heating element arranged transversally asymmetrically relative to the elongate body is at least partly trough-shaped for heating the lower side and the upright sides of at least a longitudinal part of the body, the thermal energy radiated by said element being distributed transversally over the inner side of the trough-shaped heating element or heating element part in a substantially homogeneous manner. In this manner, the body or the part of the body, at its boundaries which contact the wall of a vessel or other elongate container supporting the body, for example, in the form of a tube, can be given a uniform supply of thermal energy which differs from the supply of thermal energy to the free upper surface of the body or part of the body. The expression "at least partly trough-shaped heating element" is to be understood to mean herein that the heating element may possibly have a continuation to above the body which, however, produces less thermal energy than the trough-shaped part. A screen of a refractory material is preferably used between the at least partly trough-shaped heating element and at least the lower side of the body of material to be treated. Such a screen may consist of a refractory metal, for example tungsten, molybdenum or platinum, which receives the radiant heat of the trough-shaped heating element and uniformly distributes it due to its good thermal conductivity and radiates it uniformly in the direction of the body or part of the body to be heated. It may also consist of another refractory material, for example, a ceramic material, and possibly from a material which is transparent to thermal radiation. The screen may be trough-shaped and also extend between the lateral boudaries of the body of the material to be treated and the upright wall parts of the trough-shaped heating element.

In order to obtain a transversally uniform thermal radiation of the trough-shaped part of the heating element, the latter preferably comprises an at least partly trough-shaped resistance heater which comprises half turns extending transverse to the longitudinal direction of the body and being adapted to the trough-shape. The resistance heater may entirely consist of half turns in which it is entirely trough-shaped; in addition to the half turns, the resistance heater may also comprise whole turns, in which the half turns and half of the whole turns are present in the trough-shaped part of the heating element in question. In principle, the current across said half turns may be distributed by arranging them mutually in parallel, but the half turns are preferably arranged in series, inter alia for a better controllable heating.

Another heating element is preferably used above at least a longitudinal part of the body of the starting material. The material of the body or the longitudinal part of the body which is melted, is preferably heated to a higher temperature by the trough-shaped part of the heating element than by the heating element present above the melt. In this manner, the formation of a convex solidification front is additionally stimulated. The heating element present above the material preferably has an elongate shape, its longitudinal direction coinciding approximately with the longitudinal direction of the body.

As described in French Patent Specification No. 2,116,664, temperature gradients may be used near the solidification front in the longitudinal direction of the body of the starting material so as to achieve a better crystal growth, said temperature gradients being larger near the wall of the elongate vessel in which the body is present than in surface parts of the starting material farther remote from said wall. To that end, in the above-mentioned preferred embodiment of the present method according to the invention in which another heating element is used above the body, said upper heating element, viewed from the melt, preferably also projects beyond the trough-shaped heating element in the longitudinal direction towards the side of the growing single crystal.

A single, at least partly trough-shaped heating element may be used. By moving the body of the starting material relative to said heating element, the solidification front can be moved in the longitudinal direction through the body. According to a preferred embodiment, a series of at least partly trough-shaped heating elements juxtaposed in the longitudinal direction and energizable individually are used according to the principle described in the French Patent Specification No. 1,494,831. The solidification front is preferably moved by controlling the energization of the individual trough-shaped heating elements. A mechanical movement of the material is to be treated and/or the heating elements need not be used. Such mechanical movements may produce mechanical vibrations which may cause the formation of lattice defects, such as dislocations, or even crystal nuclei. A screen of a refractory material is preferably used between each of the said at least partly trough-shaped heating elements and the body. It is not necessary to use an associated other heating element with each at least partly trough-shaped heating element. In agreement with French Patent Specification No. 2,116,664 and according to a preferred embodiment, one elongate element is used above the body of the starting material, said element covering substantially the whole length of the series of at least partly trough-shaped heating elements. The last-mentioned heating element may be constructed in the form of a tube but may also be given a larger width, for example, in that it is provided with a zig-zagging or meandering resistance heater.

For growing the crystal, according to a preferred embodiment of the method according to the invention, a molten zone is moved through the body by means of the heating elements. According to another preferred embodiment, the body of the starting material is melted substantially throughout its length by means of the heating elements, after which cooling is carried out from one end. In the above-described cases a seed crystal is preferably introduced previously and the solidification front is moved from said seed crystal. It is possible in principle to manufacture single crystals of any desired meltable crystalline material by means of the method according to the invention. The method may be readily used, for example, for the manufacture of a single crystal of a semiconductor material, even of semiconductor compounds, in particular of the III–V type. Single crystals of III–V compounds, especially arsenic-containing III–V compounds, can be manufactured in this manner with a good quality. For example, crystals of gallium arsenide with larger diameters and with small dislocation densities are obtained, for example, gallium arsenide crystals having weights of approximately 1 kgm and cross-section all areas of more than 10 cm$^2$.

In the case in which a single crystal of a compound is manufactured, according to a preferred embodiment, the starting material may be one or more of the components which can easily be brought in a meltable form and the other component or components may be added differently, preferably from the gaseous phase. For example, for the preparation of single crystals of gallium arsenide, the starting material may be molten gallium in which arsenic from the gaseous phase is dissolved. According to another preferred embodiment, however, excellent results can also be obtained with the present method by choosing a starting material which consists at least mainly of the material of the crystal to be formed.

A solvent of the material to be crystallized may also be used for the melt, for example, when a molten zone is used which is moved through the starting material. Said solvent may consist of an excess of one of the components. The starting material may consist at least mainly of the material of the crystal to be formed. However, with the method according to the invention a melt may also be formed which consists at least mainly of the material of the crystal to be formed if said material is at least congruently meltable. The invention furthermore extends to monocrystalline bodies obtained by using the method according to the invention.

The invention furthermore relates to an apparatus suitable for use in carrying out the method according to the invention, which apparatus comprises an elongate furnace in which an elongate hollow space is present. According to the invention, said furnace comprises at least partly trough-shaped heating element which transversally surrounds the hollow space approximately semi-circularly, at least of a part of its length, as far as the trough-shaped portion is concerned, and at least one other heating element which assumes another transversal position relative to the hollow space than the trough-shaped portion of the at least partly trough-shaped heating element, means being present to cause the two heating elements to operate independently of each other. The at least partly trough-shaped heating element preferably comprises a resistance heater which has half turns extending transverse to the longitudinal direction of the furnace. Said half turns are preferably conductively connected together in a series arrangement. The other heating element preferably has an elongate shape, its longitudinal direction being approximately in the longitudinal direction of the furnace. Said other heating element preferably projects in the longitudinal direction at least on one side beyond the at least partly trough-shaped heating element. A screen of a refractory material is preferably arranged in the hollow space of the furnace between at least the bottom part of the trough-shaped portion of the at least partly trough-shaped heating element and the axis of the hollow space.

In order to be able to adjust a controllable gas atmosphere during the crystal growth process and/or to be able to screen the material for the crystal from atmospheric influences, the hollow space is preferably present in a tubular chamber. When using a screen such a screen is preferably placed outside said tubular chamber and preferably also serves as a support for said chamber.

The apparatus may comprise, in the usual manner, means for moving the material to be treated relative to the heating elements. According to a preferred embodiment, the apparatus comprises a furnace having a series of at least partly trough-shaped heating elements which are juxtaposed in the longitudinal direction and which can be energized individually. Moving parts are not necessary since a temperature gradient for the formation of a solidification front can be controlled by controlling the energization of the at least partly trough-shaped heating elements. A separate screen is preferably used with each at least partly trough-shaped heating element so as to prevent the temperature gradient for the solidification front from being smoothed too much by the thermal dissipation in the longitudinal direction of the furnace.

The invention will be described in greater detail with reference to the accompanying drawing.

Figure 1:
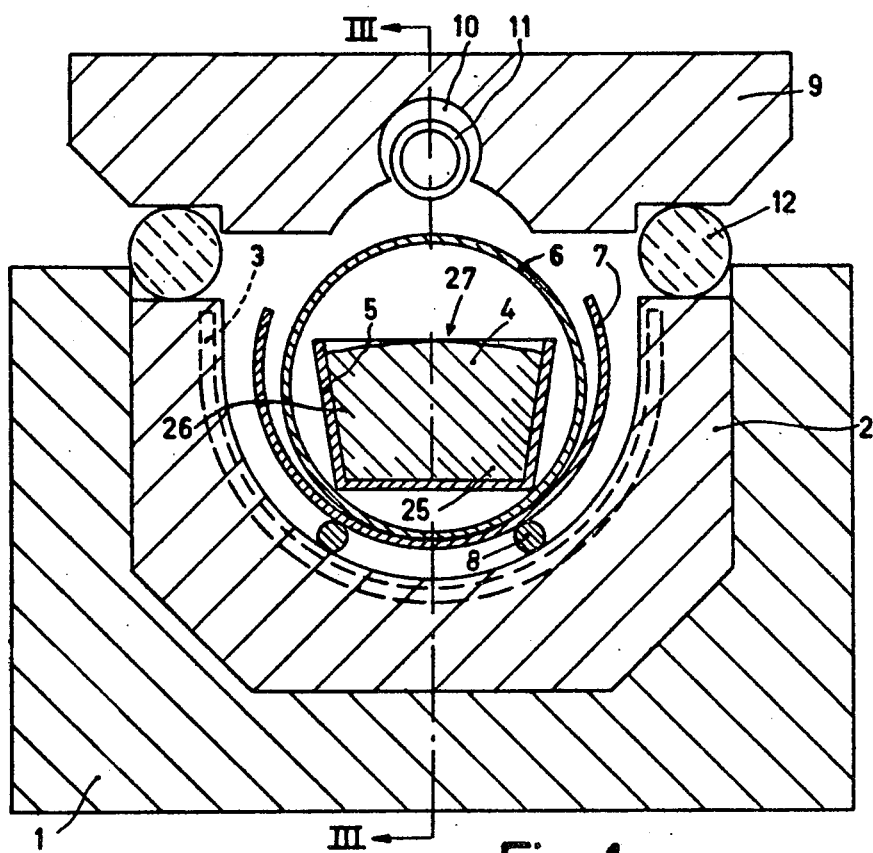
FIG. 1 is a diagrammatic cross-sectional view of an embodiment of a furnace belonging to an apparatus suitable for use in the horizontal growth of a single crystal from a melt according to the invention.
Figure 3:
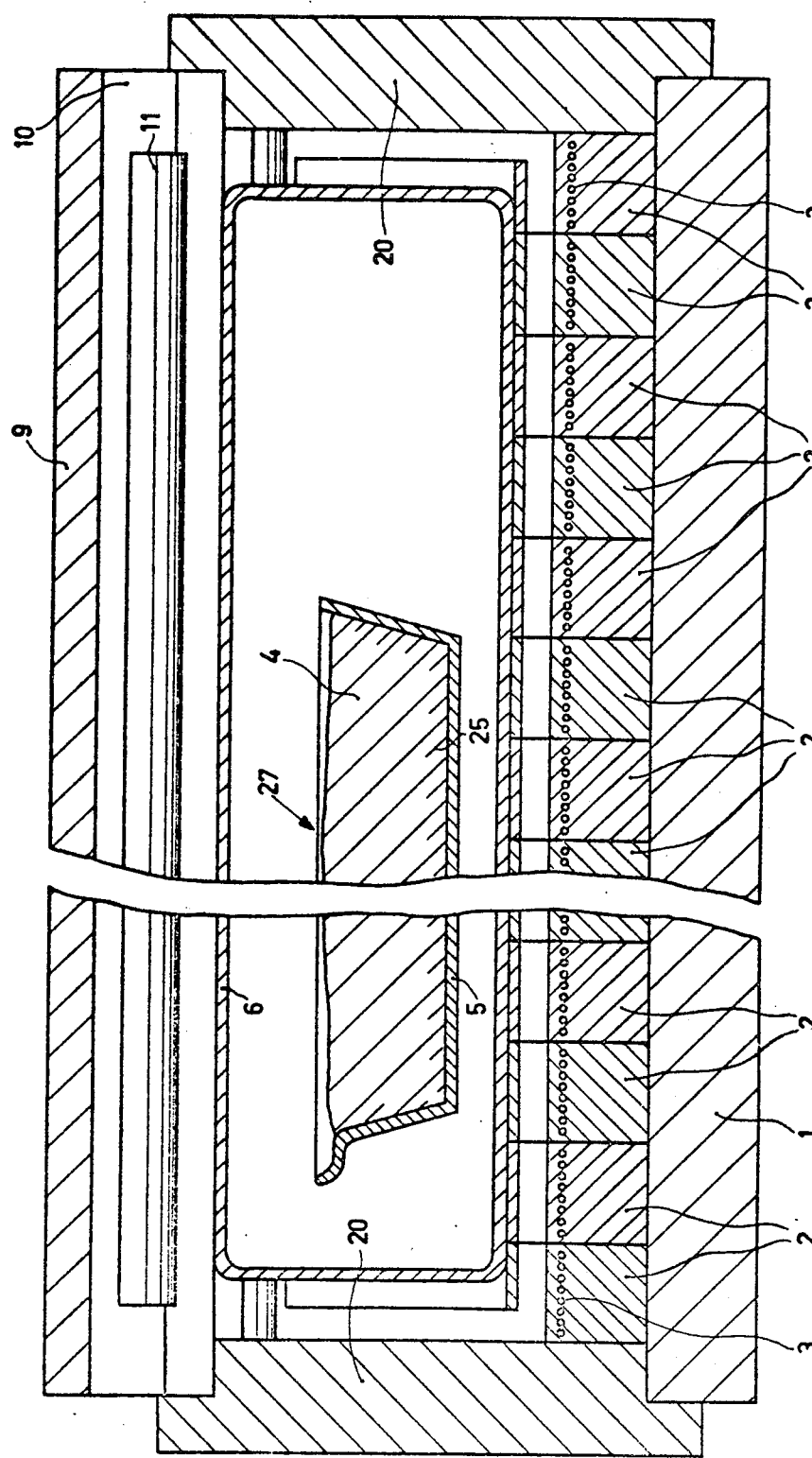
FIG. 3 is a diagrammatic vertical longitudinal sectional view of the furnace shown in FIG. 1.

The furnace shown in FIGS. 1 and 3 comprises a furnace jacket 1 of thermally insulating material in which a series of trough-shaped heating elements 2 are juxtaposed in the longitudinal direction of the furnace. Said heating elements divide the furnace into individually heatable segments. Each heating element 2 comprises a resistance heater 3 which is embedded in a refractory material. The trough-shaped heating elements 2 radiate their heat to a space which is enclosed laterally and on the lower side by the series of heating elements, in which space a body 4 of a starting material to be heated is placed in a vessel 5. Said vessel 5 is placed inside a tubular chamber 6 of a refractory material, for example quartz-glass, which extends substantially throughout the length of the series of heating elements. Screens 7 of a refractory material, for example of aluminium oxide, are placed between the tube 6 and each of the heating elements 2. The screen 7 may be trough-shaped but may also be restricted to the lower parts of the furnace space. It may also serve as a support for the tubular chamber 6. The screen 7 with the tubular chamber 6 bears on cylindrical or tubular rods 8 which also consist of a refractory material and extend in the longitudinal direction of the furnace. Closing members 20 of a thermally insulating material are placed at either end of the furnace.

The upperside of the furnace is closed by a cover 9 of a refractory material which partially encloses a heating element 11 in a recess 10 extending in the longitudinal direction of the furnace, said heating element 11 extending nearly throughout the length of the furnace. Observation windows in the form of rods 12 of a transparent refractory material extending in the longitudinal direction of the furnace are provided between the trough-shaped heating elements 2 and the cover 9.

The extent of heating inside the furnace can be varied segment-wise by the individual energization of the trough-shaped resistance heaters 3. The temperature of each trough-shaped heating element 2 can be measured by means of thermoelements (not shown), at least one thermoelement being provided per heating element 2.

Figure 2:
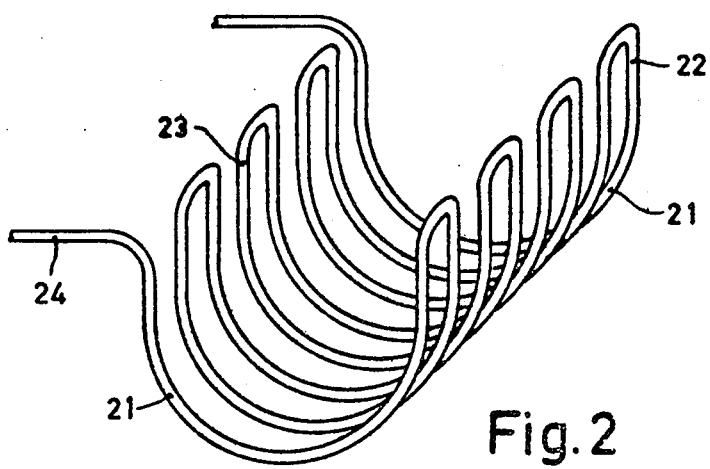
FIG. 2 is a diagrammatic perspective view of a trough-shaped resistance heater to be used in such a furnace.

A resistance heater 3 is shown in FIG. 2. Said resistance heater is constructed from half turns which are connected together in series arrangement. Each half turn consists of a semi-circular part 21, possibly with vertical straight extensions 22 and 23. The ends 24 of the resistance heater are bent and serve for connection purposes.

When a longitudinal part of the body 4 is heated by means of a heating element 2, the bottom of the vessel 5 where the lower parts 25 of the body 4 are present, will receive mainly thermal energy originating from the semi-circular parts 21. Thermal energy originating from the vertical parts 22 and 23 will mainly be radiated towards the sides of the vessel 5 where the parts 2 of the body 4 are present. The free surface 27 of the body 4 mainly receives radiation from the heating element 11.

For example, from a body 4 having a cross-sectional all area exceeding 10 cm², a single crystal can be obtained from seed crystal by means of the furnace by energizing so many segments that the body is melted up to the seed crystal, after which, by successively reducing the energization of successive heating elements 2, the single crystal grows by progressing solidification from the seed crystal. The way of controlling the energization of the trough-shaped resistance heaters 3 and the heating element 11 can in general be effected in a manner corresponding to that described in the French Patent Specification No. 2,116,664 while adapting the used larger cross-section of the body 4. For preparing single crystals from gallium arsenide starting from gallium and aresenic or from gallium arsenide, information is available from literature to those skilled in the art in which reference is also made to the French Patent Specification No. 1,494,831 to which the French Patent Specification No. 2,116,664 is an addition. However, while using the apparatus described in the Figures, crystals, for example gallium arsenide crystals, are manufactured having larger diameters and a quality which can be realized with the apparatus described in the said French Patent Specifications with smaller cross-sections only.

For example, such a crystal can be obtained by using a vessel 5 having at one end a projection with raised bottom on which a seed crystal (not shown) of gallium arsenide is arranged, in this case at the left-hand end of the crucible 5 in FIG. 3. The batch 4 consists of pure gallium while a quantity of arsenic is provided in the cylindrical chamber 6 which is more than the stoichiometric quantity corresponding to the quantity of gallium for the formation of gallium arsenide so as to retain a quantity of free arsenic in the chamber which is at least sufficient for the formation of arsenic vapour with a pressure of approximately 1 atmosphere. The arsenic is present, for example, in the part of the chamber 6 which is present on the right-hand side of the vessel 5 in FIG. 3. The furnace is given a position in which the body 4 of gallium remains out of contact with the seed crystal also after melting. First the gallium arsenide may be formed, it being ensured that at the area of the seed crystal the temperature cannot rise to above the melting point of gallium arsenide, for example, by heating the extreme left-trough-shaped furnace segments not too high so that the temperature of the seed crystal remains betwen 600° and 1200°C. By gradually subjecting the trough-shaped elements at the level of the crucible to a higher load, the gallium is melted. After melting the gallium, the gallium is gradually heated to above 1200°C, the remaining trough-shaped heating elements being gradually heated to 600°C, an arsenic-vapour pressure of about 1 atmosphere being built up. The arsenic vapour reacts with the gallium and forms substantially entirely gallium aresenide. The melt-volume increases so that the melt contacts the seed crystal. By programmed cooling from left to right by suitable control of the energization of the trough-shaped heating elements 2, a gallium arsenide single crystal is grown from the seed crystal. During this and the preceding treatments the heating element 11 is also energized in such manner that the melt is heated at its upperside, it is true, but said melt receives thermal energy mainly from the trough-shaped heating elements. A convex solidification front is obtained. The control of the various heating elements is arranged so that the temperature in the chamber 6 can nowhere drop below 60°C and the solidification front moved in the vessel 5 at a rate in the order of 10 mm per hour until the whole melt has disappeared and an elongate gallium arsenide crystal has formed in the vessel 5. In this manner, crystals of gallium arsenide have been obtained which have a cross-sectional area of over 10 cm² and a weight in the order of 1 kgm or more of a good quality.

What is claimed is:

1. In a method of manufacturing rod-shaped single crystals from a starting material in the form of an elongate body positioned approximately horizontally by monocrystalline deposition in the longitudinal direction of said body from a melt formed at least in a longitudinal part of said body, the improvement which comprises forming said melt by heating said body with individually energizable heating elements at least one of which heating elements is not in contact with said body and has a transversally asymmetric position relative to said body, said transversally asymmetrically positioned heating element being trough-shaped thereby to allow for the heating of the lower side and upright sides of at least a longitudinal section of said body, said transversally asymmetric heating element comprising a substantially trough-shaped resistance heater having half turns extending transversally to the longitudinal direction of said body and the thermal energy, radiated by said element, being divided transversally in a substantially homogeneous manner over the inner side of the trough-shaped heating element and including a screen of a refractory material between the trough-shaped heating element and the bottom and sides of the body, said screen being out of contact with said body and any container for said body and being in a fixed position in regard to said heating element.

2. A method as claimed in claim 1 wherein the half turns are arranged in series.

3. A method as claimed in claim 1 wherein a further heating element is arranged above at least a longitudinal part of the body.

4. A method as claimed in claim 3 wherein the trough-shaped heating element heats the material of the body or the longitudinal part of the body which is melted, to a higher temperature than the heating element present above the melt.

5. A method as claimed in claim 4, wherein the heating element present above the material has an elongate shape, its longitudinal direction coinciding approximately with the longitudinal direction of the body.

6. A method as claimed in claim 5 wherein, viewed from the melt, the heating element present above the material projects beyond the trough-shaped heating element in the longitudinal direction towards the side of the growing single crystal.

7. A method as claimed in claim 1 wherein a series of trough-shaped heating elements is used which are juxtaposed in the longitudinal direction and can be energized individually.

8. A method as claimed in claim 7 wherein one heating element for the heating of the upperside of the melt is used substantially throughout the length of the series of trough-shaped heating elements.

9. A method as claimed in claim 8 wherein the movement of the solidification front during the crystallization is produced by controlling the energization of the individual trough-shaped heating elements.

10. A method as claimed in claim 1 wherein a molten zone is moved through the elongate body by means of the heating elements.

11. A method as claimed in claim 1 wherein the starting material is melted substantially throughout its length after which cooling is carried out from one end.

12. A method as claimed in claim 1 wherein a seed crystal is provided at one end of the elongate body, the solidification front being moved from said seed crystal.

13. A method as claimed in claim 1 wherein a single crystal of a semiconductor material is formed.

14. A method as claimed in claim 13 wherein a single crystal of a compound of the III–V type is formed.

15. A method as claimed in claim 14 wherein in that the III–V compound contains arsenic.

16. A method as claimed in claim 15 wherein the III–V compound is gallium arsenide.

17. A method as claimed in claim 1 wherein the starting material comprises at least one of the components of the single crystal to be manufactured.

18. A method as claimed in claim 17 wherein at least one of the components of the single crystal to be manufactured is supplied from the gaseous phase.

19. A method as claimed in claim 17 wherein the starting material consists at least mainly of the material of the crystal to be formed.

* * * * *